(12) United States Patent
Yaguchi et al.

(10) Patent No.: US 6,495,838 B1
(45) Date of Patent: Dec. 17, 2002

(54) SAMPLE HEATING HOLDER, METHOD OF OBSERVING A SAMPLE AND CHARGED PARTICLE BEAM APPARATUS

(75) Inventors: Toshie Yaguchi, Minori-machi (JP); Takeo Kamino, Hitachinaka (JP); Masahiro Tomita, Hitachinaka (JP); Kishio Hidaka, Hitachiota (JP)

(73) Assignees: Hitachi, Ltd., Tokyo (JP); Hitachi Science Systems, Ltd., Hitachinaka (JP)

( * ) Notice: Subject to any disclaimer, the term of this patent is extended or adjusted under 35 U.S.C. 154(b) by 0 days.

(21) Appl. No.: 09/354,633

(22) Filed: Jul. 16, 1999

(30) Foreign Application Priority Data

Jul. 23, 1998 (JP) .......................... 10-207556

(51) Int. Cl.⁷ .............................. H01J 37/20
(52) U.S. Cl. .................................. 250/443.1
(58) Field of Search .................. 250/443.1, 440.11, 250/309, 492.21, 310

(56) References Cited

U.S. PATENT DOCUMENTS

| | | | | |
|---|---|---|---|---|
| 4,232,453 A | * | 11/1980 | Edelmann | 34/92 |
| 4,242,586 A | * | 12/1980 | Warble | 250/443 |
| 5,367,171 A | * | 11/1994 | Aoyama et al. | 250/443.1 |
| 5,898,177 A | * | 4/1999 | Hidaka et al. | 250/311 |
| 5,986,270 A | * | 11/1999 | Bormans et al. | 250/442.11 |
| 6,025,592 A | * | 2/2000 | Knowles et al. | 250/310 |
| 6,039,000 A | * | 3/2000 | Libby et al. | 118/723 E |

FOREIGN PATENT DOCUMENTS

| | | | | |
|---|---|---|---|---|
| JP | 6-44936 | | 2/1994 | |
| JP | 6-68828 | | 3/1994 | |
| JP | 06-103947 | | 4/1994 | |
| JP | 9-27291 A | * | 1/1997 | H01J/37/18 |

* cited by examiner

*Primary Examiner*—Kiet T. Nguyen
(74) *Attorney, Agent, or Firm*—Kenyon & Kenyon

(57) ABSTRACT

High resolution observation of a sample at a high temperature above 1000° C. is accomplished by suppressing sample drift by heating over a short time and with small electric current. A heater envelope made of a ceramic having a carbon coating on the surface is attached around a heater surrounding the sample. The heater envelope is rotatable around pivot screws, and has an outer frame portion of a holder individually having slots capable of letting an FIB enter so that the sample mounting on the holder, as it is, may be milled with the FIB.

12 Claims, 9 Drawing Sheets

FIG. 2A  FIG. 2B  FIG. 2C
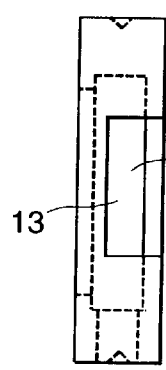
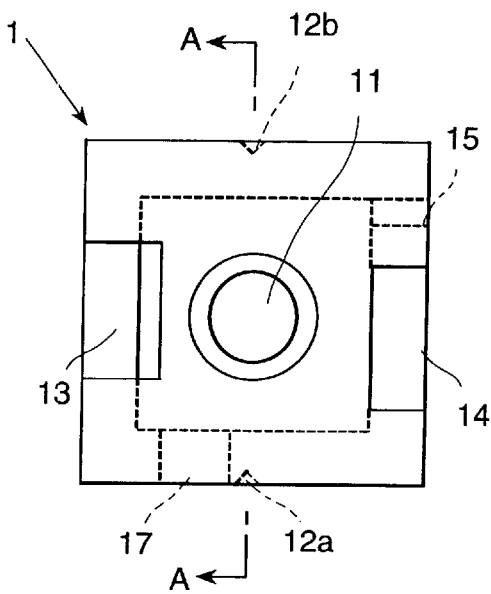
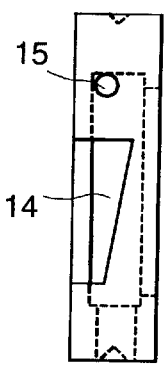
FIG. 2D  FIG. 2E
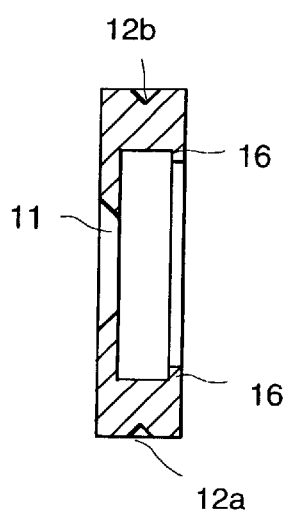
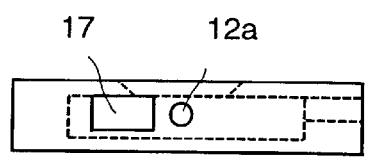

SAMPLE HEATING HOLDER, METHOD OF OBSERVING A SAMPLE AND CHARGED PARTICLE BEAM APPARATUS

BACKGROUND OF THE INVENTION

The present invention relates to a sample heating holder used for an electron microscope by which a sample is heated in the electron microscope to observe change in the sample caused by heating.

As a conventional sample heating holder, Japanese Utility Model Application Laid-Open No.58-173159 discloses a type of sample heating holder which fixes a sample in a heating furnace. Thickness of the heating furnace type sample heating holder is increased by a thickness corresponding to the heating furnace. Further, a high melting point metal of platinum is often used for the sample table for fixing a sample.

On the other hand, a type of sample heating holder other than the heating furnace type is disclosed, for example, in Japanese Patent Application Laid-Open No.6-44936. The sample heating holder uses a heater which is wound in a coil-shape and placed horizontally. A sample is heated by directly placing inside the coil, or a finely powdered sample is heated by directly sprinkling it on the heater. In this case, the sample can be heated up to high temperature with small electric current. In addition to this, since the sample heating holder is of a direct heating type and the sample and the heater are small in size, it is possible to obtain a desired constant temperature in a short time from starting of heating and to perform high resolution observation at high temperature. Further, since the sample heating holder has no structure preventing detection of an X-ray in energy dispersive X-ray (hereinafter, referred to as "EDX") analysis, it is possible to perform the EDX analysis under room temperature. The heater is detachable.

A sample heating holder using a flat ceramic heater as the heater is disclosed in Japanese Patent Application Laid-Open No.6-68828. In this case, the sample heating temperature is approximately 200° C., and the sample table has abi-axial or double tilting mechanism.

However, the sample heating holder of heating furnace type described above has problems in that the time required to transfer heat to the sample is long because of indirect heating and in that the sample is melt-fixed onto the sample table by heating. Further, the sample heating holder is of the structure setting the sample on the bottom portion of the heating furnace, and therefore EDX analysis of the sample is not taken into consideration. Furthermore, there is a limitation in the heating temperature. On the other hand, the above-mentioned sample heating holder of the type of directly placing the sample on the coil has a limitation that the sample needs to be formed in powder or in a ribbon-shape. The above-mentioned sample heating holder using the flat ceramic heater has problems in that the time required to heat up and stabilize temperature constant is long and in that there is a limitation in the heating temperature.

Catalysts, materials for thermal plant or nuclear plant and so on require material property at a high temperature above 1000° C. or structural analysis in the atom level in order to investigate a process of change in the material property. However, it is difficult to observe the process of change in the material property by the conventional technologies described above. Therefore, each of samples of a material treated at various temperatures is formed in a thin film for electron microscope observation to perform analysis for each treatment temperature.

By checking whether or not the change in the process in the thin film state agrees with a change in the process of heating the material in a bulk state under the same heating condition, it is possible to check whether or not a phenomenon produced in a thin film sample agrees with that in an actual material. However, in the conventional technology, in order to repetitively mill a bulk portion of a single sample after heating, it is required to extract the sample by detaching heaters attached onto the upper side and the downside of the sample and to perform milling by setting the sample to a holder for a focused ion beam (hereinafter, referred to as "FIB") milling apparatus. Therefore, since the material becomes brittle by heating, the sample is probably damaged at handling to lose a position to be observed.

SUMMARY OF THE INVENTION

The present invention aims at solving such problems in the conventional technology. An object of the present invention is to provide a sample heating holder for electron microscope which can suppress sample drift caused by heating in a short time irrespective of a shape of the sample, and can perform high resolution observation of a sample heated up to a temperature above 1000° C. with small electric current. Further, another object of the present invention is to provide a sample heating holder for electron microscope and a method of observing a sample using the sample heating holder by which after observing a sample under a heating condition, re-milling of a bulk portion of the same sample using an FIB milling apparatus and re-observation of the bulk portion of the same sample using the electron microscope can be performed. Accordingly, observation of an inner bulk portion of the sample under a heating condition and verification by comparing it with a thin film portion can be performed.

The inventors of the present invention fabricated a prototype of a sample heating holder having a structure that a high melting point metal wire coated with a ceramic on the outer surface was used as a heating heater, and an upper surface and a lower surface of a sample were brought directly in contact with the heater. This prototype holder could be directly heated up to approximately 1800° C. However, it was founded that a problem of sample drift caused by thermal expansion of the heater newly occurred. In the high resolution observation in the atomic level, a lattice image of 0.1 to 0.5 nm interval generally needs to be identified, but the required time that the sample reached a thermal equilibrium state in a high temperature and stabilized in a condition capable of performing high resolution observation was long. In addition, there was a problem in that the heating efficiency was low because of heat loss from the sample by thermal dissipation.

The present invention is a result of such a study by which it is found that by attaching a thermally and electrically insulating heater envelope having a carbon coating on the surface around a heater surrounding a sample of a sample heating holder for electron microscope, the thermal expansion at heating and the thermal dissipation can be prevented, and stability of the sample at high temperature can be obtained in a short time.

Further, the other object can be attained by that openings for introducing an FIB are formed in a side surface portion of the heater envelope of the sample heating holder and in a side surface portion of the holder so as to mill the sample by the FIB. The sample heating holder mounted with the sample which has been observed under a heating condition, as it is, is set in an FIB milling apparatus to mill the un-milled bulk portion of the sample through the openings. After milling, the sample heating holder mounted with the milled sample is again set in the electron microscope to observe the sample. Thus, observation of an inside of the bulk portion under a heating condition and verification by comparing it with a thin film portion can be performed.

That is, a sample heating holder for electron microscope in accordance with the present invention is characterized by comprising a holder main body; a heater for heating a sample by directly contacting with the sample; and a thermally and electrically insulating heater envelope for preventing dissipation of heat by covering the heater, wherein the heater envelope has a carbon coating on a surface, and the heater is fixed to the heater envelope.

The heater envelope has a function to improve the heat efficiency, and a function to fix and fasten the heater, that is, a function to prevent the sample draft caused by thermal expansion of the heater. From the viewpoint of heat resistance and low thermal expansion coefficient, it is preferable that the heater envelope is made of a ceramic. In order to provide the heater envelope with the function to improve the heat efficiency by preventing heat dissipation from the heater, it is not always necessary that the heater envelope completely covers the heater from all the directions. Fixing of the heater to the heater envelope can be performed, for example, using a high temperature thermosetting liquid inorganic heat resistant adhesive. By fixing the sample to the heater using a high temperature thermosetting liquid inorganic heat resistant adhesive, the effect of preventing the sample drift can be further improved.

Further, by coating the heater envelope with carbon through a vapor deposition method or the like, it is possible to prevent the heater envelope from charging up by giving electric conductivity to the heater envelope, and it is also possible to prevent occurrence of noise from the heater envelope due to scattered electrons incident to the heater envelope in EDX analysis at room temperature.

By rotatably attaching the heater envelope to the holder main body, it is possible to form a bi-axial or double tilting mechanism by combining with rotation around an axis of the holder main body in the lateral direction and, therefore, to vary an orientation of a crystal to be observed. In addition, it is preferable that the heater envelope is detachable to the holder main body.

The heater envelope has necessary openings such as an opening for letting an electron beam pass through, an opening for extracting a X-ray emitted from the sample by irradiation of the electron beam and an opening for loading and unloading the sample. The opening may be any shape such as a hole-shape, or a notch shape extending from a free edge portion of the heater envelope. Through the openings formed in the heater envelope, it is possible to perform electron microscopic observation or X-ray analysis of a sample, and it is also possible to take out the sample after performing heating, observation or analysis.

The heater envelope may comprise an opening for letting a focused ion beam for milling the sample pass through in a side surface portion. By such a heater envelope, the heater envelope having a sample fixed to the inner heater is extracted from the holder main body and fixed to a holder of an FIB milling apparatus, and then a bulk portion of the sample can be milled by letting an FIB entering through the opening formed in the side surface portion of the heater envelope.

Further, the heater envelope may comprise an opening for letting a focused ion beam for milling the sample pass through in a side surface portion, and the holder main body may comprise an opening at a position overlapping with the opening formed on the side surface of the heater envelope. By such a sample heating holder, the heater envelope having the sample fixed inside is extracted together with the holder main body from the electron microscope and set in the FIB milling apparatus, and an un-milled bulk portion of the sample can be milled by irradiating an FIB on the sample through the opening of the holder main body and the opening at the side surface portion of the heater envelope overlapping with the opening of the holder main body. After finishing milling of the sample, by extracting the holder attached with the heater envelope from the FIB milling apparatus and setting it to the electron microscope, microscopic observation of the milled bulk portion of the sample can be performed.

A method of observing a sample according to the present invention is characterized by a method using the sample heating holder for electron microscope comprising the heater envelope having an opening for FIB milling or the sample heating holder for electron microscope comprising the openings formed in both of the heater envelope and the holder main body described above, which comprises the steps of observing a sample fixed to and heated by the heater of the sample heating holder using an electron microscope; extracting the sample heating holder for electron microscope from the electron microscope and milling an un-milled bulk portion of the sample using a focused ion beam milling apparatus without detaching the sample from the heater; and loading the heater of the sample heating holder for electron microscope holding the milled sample to the electron microscope and observing the portion of the sample milled in the above step using the electron microscope. Fixing of the sample to the heater can be performed using a high temperature thermosetting liquid inorganic heat resistant adhesive.

According to the sample heating holder in accordance with the present invention, high resolution observation of a sample at a high temperature above 1000° C. by suppressing sample drift by heating in a short time and with small electric current. Further, according to the method of observing a sample in accordance with the present invention, a phenomenon occurring in a thin film portion can be verified by comparing it with a phenomenon occurring in a bulk portion re-observation.

BRIEF DESCRIPTION OF DRAWINGS

FIG. 2A to FIG. 2E are a plan view, a side view and a cross-sectional view showing an example of a heater envelope.

DESCRIPTION OF THE PREFERRED EMBODIMENTS

Figure 1:
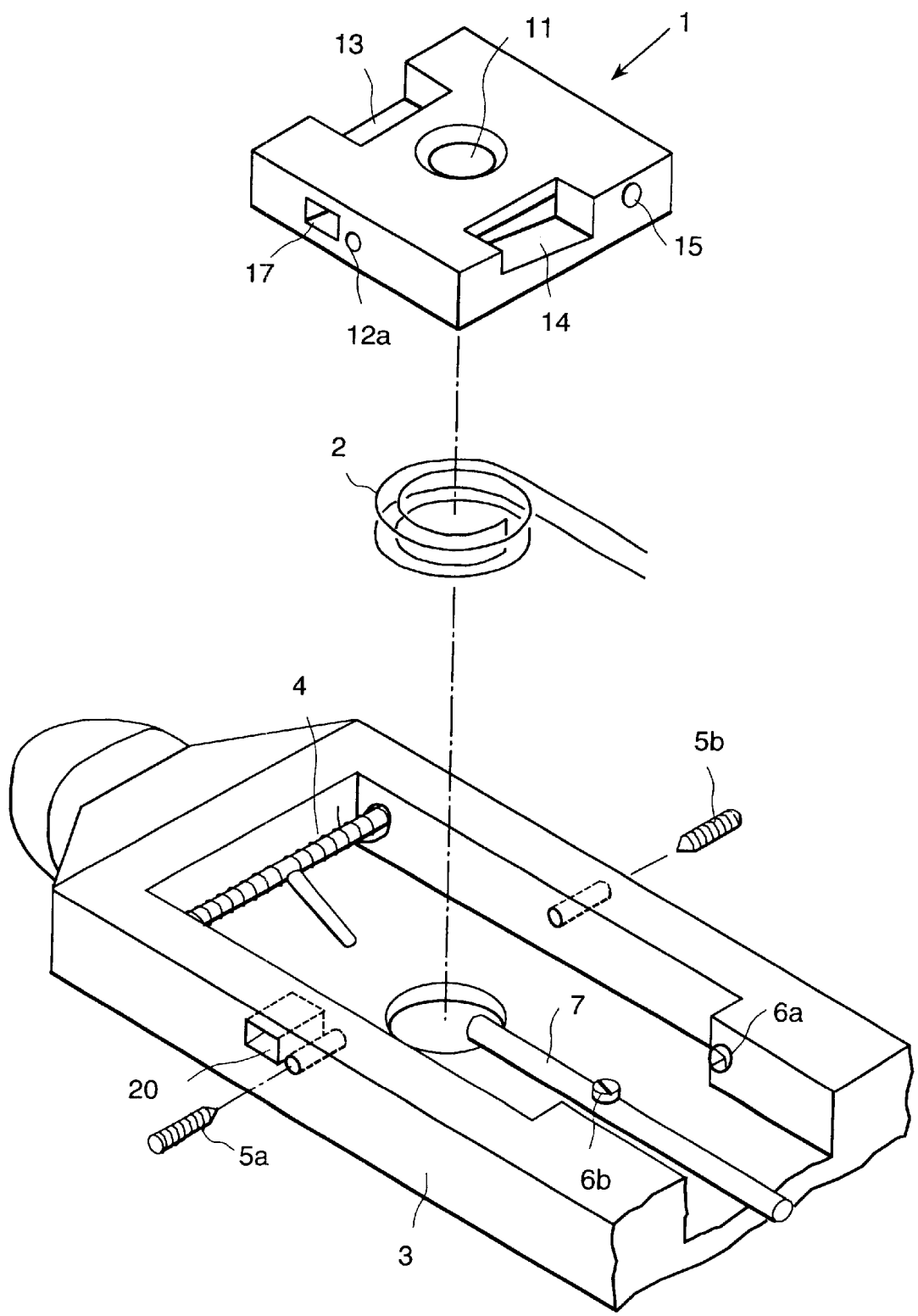
FIG. 1 is an exploded perspective view showing an example of an front end portion of a sample heating holder in accordance with the present invention.
Figure 3:
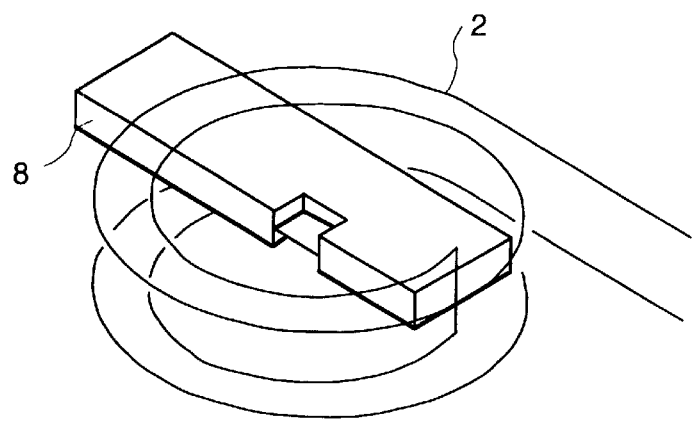
FIG. 3 is a view explaining the positional relationship between the heater and a sample.
Figure 4:
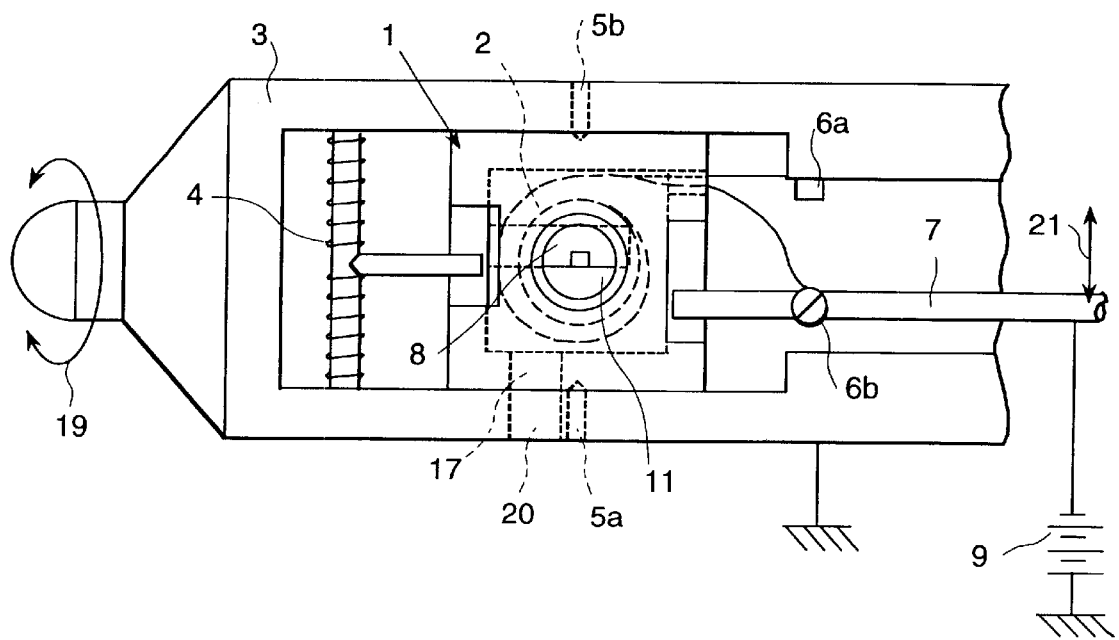
FIG. 4 is a plan view showing the holder front end portion in a state that a sample, the heater and the heater envelope are attached to a holder outer frame.
Figure 5:
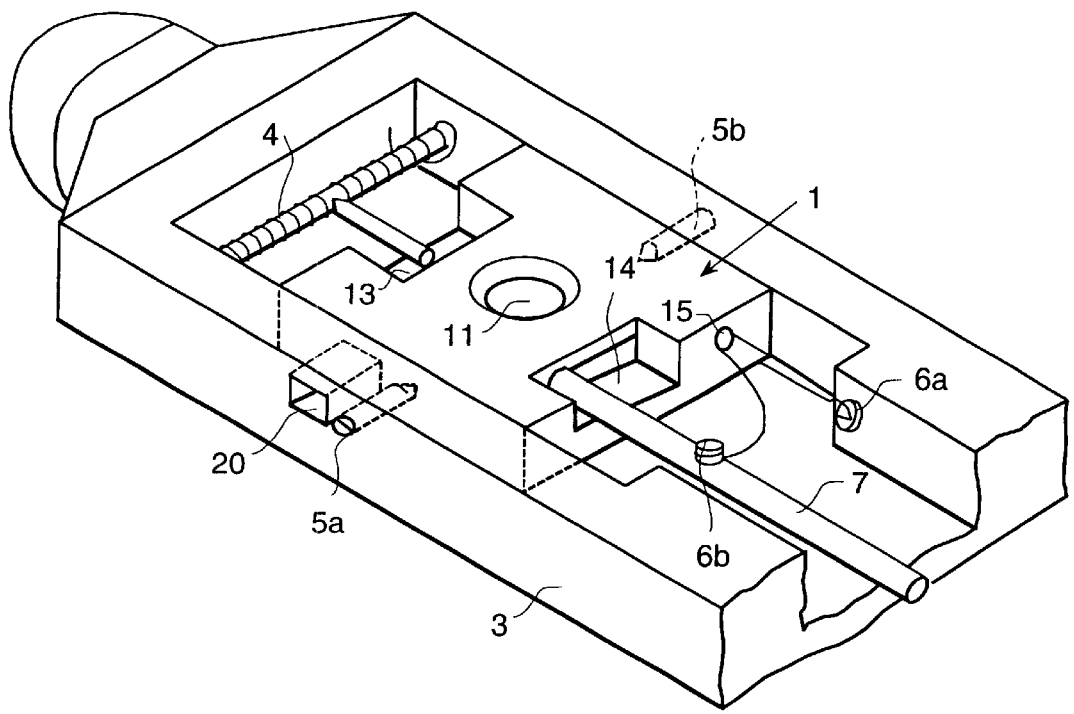
FIG. 5 is a perspective view corresponding to FIG. 4.

Embodiments of the present invention will be described below, referring to the accompanied drawings. FIG. 1 is an exploded perspective view showing an example of an front end portion of a sample heating holder for electron microscope in accordance with the present invention. FIG. 2A to FIG. 2E are a plan view, a side view and a cross-sectional view showing an example of a heater envelope. FIG. 3 is a view explaining the positional relationship between the heater and a sample. FIG. 4 is a plan view showing the holder front end portion in a state that a sample, the heater and the heater envelope are attached to a holder outer frame. FIG. 5 is a perspective view corresponding to FIG. 4.

The front end portion of the holder is composed of a heater envelope 1, a heater 2 and a holder outer frame 3. The heater envelope 1 shown here as an example is formed in a bottomless box-shape having a brim-shaped portion 16 projecting inside from a lower end of a side surface in the bottom portion. However, the heater envelope may have a bottom or no bottom at all. On a top surface of the heater envelope 1, there is formed a hole 11 which an electron beam or an X-ray for observing and analyzing a sample passes through. a receiving portion 13 for a retaining spring 4 provided in the holder outer frame 3 is formed in one side portion of the heater envelope 1, and a receiving portion 14 for a rod 7 is formed in the other side portion in the opposite side. A hole 15 for leading out a lead wire of the heater 2 outside the heater envelope 1 is formed beside the rod receiving portion 14. Depressed portions 12a, 12b for receiving ends of pivot screws 5a, 5b are formed on the other two side surfaces of the heater envelope 1. An opening 17 for letting in an ion beam for re-milling a sample is formed beside one of the depressed portions 12a.

The heater 2 is formed in a double stage coil shape and contained inside the heater envelope 1, and only the lead wire is extracted outside through the hole 15 in the heater envelope 1. The heater 2 is adhered and fixed to an inner portion of the heater envelope 1 using a high temperature thermosetting liquid inorganic heat resistant adhesive, for example, "SUMICERAM" (a trade name of a product of Asahi Chemical Industry, Co.). The sample 8 is placed between the two stages of the heater 2, and adhered and fixed to the heater 2 using a high temperature thermosetting liquid inorganic heat resistant adhesive, for example, "SUMICERAM" (a trade name of a product of Asahi Chemical Industry, Co.). The heater 2 having the sample 8 fixed between the two stages is set into the holder outer frame 3 together with the heater envelope 1 using the pivot screws 5a, 5b.

The retaining spring 4 for fixing the heater envelope, the pivot screws 5a, 5b, a screw 6b for fixing the lead wire of the heater 2, a slot 20 capable of letting in an FIB for re-milling the sample are provided in the holder outer frame 3. The slot 20 is formed at a position overlapping with an opening 17 provided in the side portion of the heater envelope 1. Further, extended in the axial direction of the sample holder is a rod 7 for fixing the heater envelope 1 and electrocally connecting the same with the rod 7 so as to permit the bi-axial or double tilting of the heater envelope 1. The rod 7 is movable in a direction of connecting between the pivot screws 5a, 5b (a direction shown by an arrow 21 of FIG. 4) by a driving means, not shown.

As shown in the side view of FIG. 2A, the heater envelope 1 is opened at a position of the retaining spring 4 provided in the one side portion, and the opening 18 is used as an inserting entrance for inserting a sample. Further, as shown in the side view of FIG. 2C, the bottom surface of the rod receiving portion 14 is inclined, and the end portion of the rod 7 contacts with the inclined surface. Therein, FIG. 2D is a cross-sectional view being taken on the plane of the line A—A of FIG. 2B.

As shown in the plan view of FIG. 4, the heater envelope 1 is rotatably supported by the screws 5a, 5b, and forced to be rotated by the retaining spring 4 so as to move downward in the one side portion. However, the movement is blocked by the rod 7 contacting with the rod receiving portion 14 provided in the other side portion. A rotating angle of the heater envelope 1 around the pivot screws 5a, 5b is determined by a position on the inclining surface of the rod receiving portion 14 which the rod 7 is brought in contact with. That is, the angle can be adjusted by changing a position of the rod 7 in the direction connecting the pivot screws 5a, 5b (the direction shown by an arrow 21 of FIG. 4). Further, the holder main body is rotatable around the axis, as shown by an arrow 19 of FIG. 4. Therefore, the sample heating holder in accordance with the present invention has a bi-axial or double tilting function by rotation around the axis of the holder main body and rotation around the pivot screws 5a, 5b of the heater envelope 1. One side of the lead wire of the heater extracted through the hole 15 provided in the side portion of the heater envelope 1 is fixed to the holder outer frame 3 with a screw 6a, and the other side is fixed to the rod 7 with a screw 6b and connected to a direct current power source 9.

Figure 6:
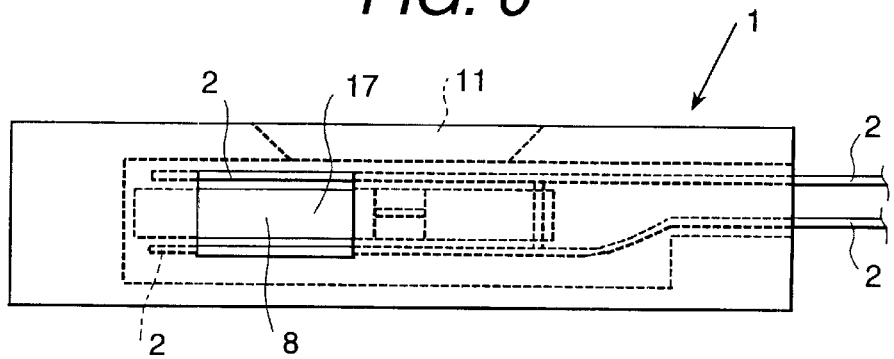
FIG. 6 is a side view showing the heater envelope in which the heater is mounted with a sample.

FIG. 3 is a view explaining the positional relationship between the heater 2 and the sample 8. The heater 2 is composed of two coil-shaped stages connected to each other, and the sample 8, a part of which is formed in a thin film by milled using an FIB milling apparatus, is arranged between the two stages. The sample 8 is directly fixed to the heater 2 using a high temperature thermosetting liquid inorganic heat resistant adhesive, for example, "SUMICERAM" (a trade name of a product of Asahi Chemical Industry, Co.). The actual gap in the heater 2 is narrower than a gap shown in FIG. 3 and is such a distance that the heater is in contact with the sample 8. Further, since the heater 2 is fixed to the inside of the heater envelope 1, attaching work of the sample 8 to the heater 2 is performed through the opening 18 of the heater envelope 1. The sample 8 is placed so that the thin portion milled with the FIB faces the slot 20 in the holder outer frame 3. FIG. 6 is a side view showing the heater envelope 1 in which the heater 2 is mounted with the sample 8. An unmilled portion of the sample 8 can be seen through the opening 17 in the side portion of the heater envelope 1.

Figure 7:
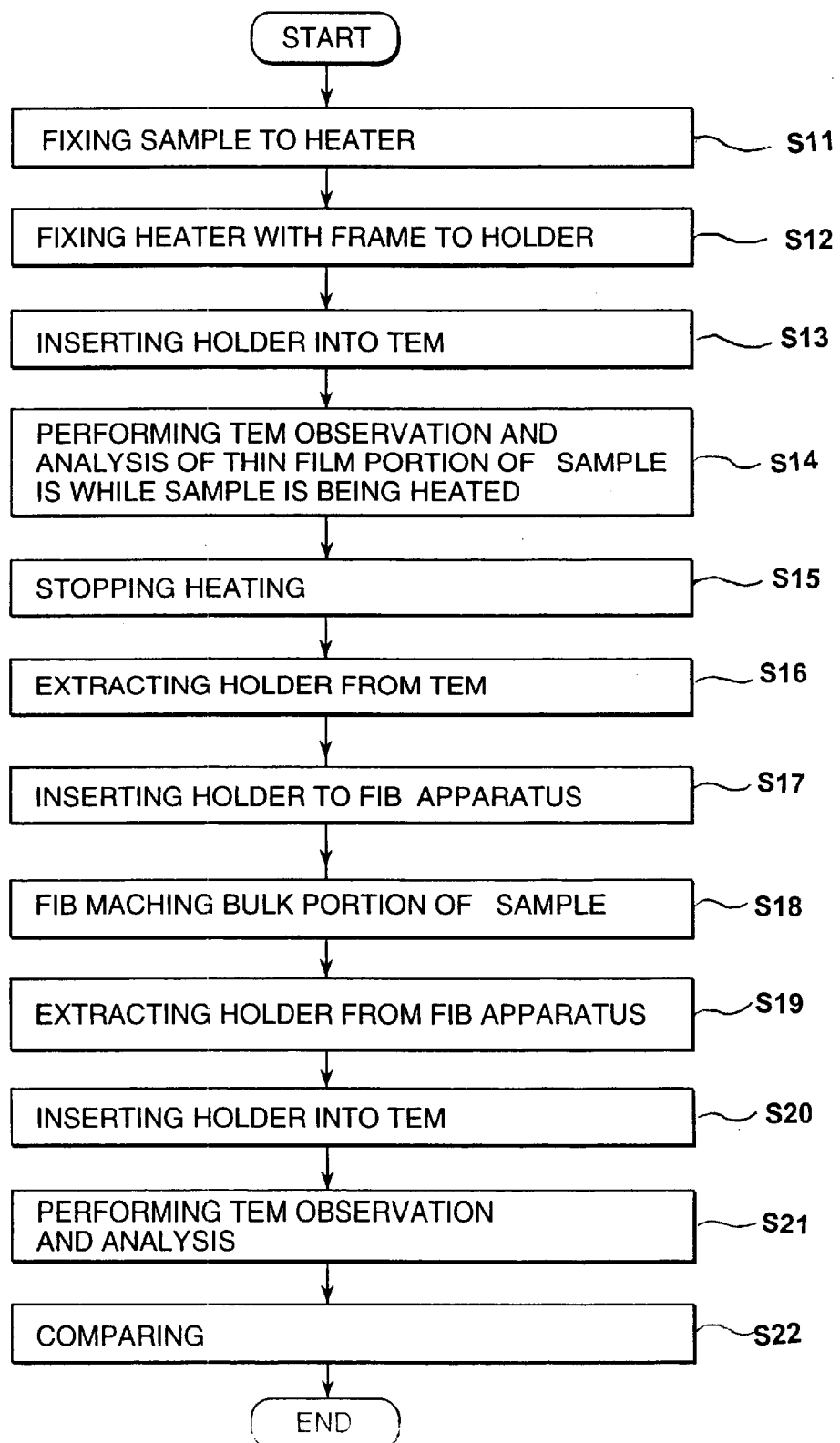
FIG. 7 is a flow chart showing the procedure of a method of observing a sample using the sample heating holder in accordance with the present invention.

FIG. 7 is a flow chart showing the procedure of a method of observing a sample using the sample heating holder in accordance with the present invention. Initially, the sample 8 milled into a thin film using the FIB milling apparatus is fixed in a gap of the heater 2 fixed to the heater envelope 1 (S11). Next, the heater envelope 1 having the fixed sample 8 is fixed to the holder outer frame 3, as shown in FIG. 4 (S12). The pivots 5a, 5b are of a screw type, and fixing of the heater envelope 1 to the holder outer frame 3 is performed as follows. Under a state that the ends of the pivot screws are drawn back, the heater envelope 1 is inserted into the holder outer frame 3 to set the retaining spring 4 and the rod 7 to the receiving portions 13, 14, respectively. Then, the ends of the pivot screws 5a, 5b are pushed into the depressed portions 12a, 12b in the side portion of the heater envelope 1 to finally fix the heater envelope 1 to the holder outer frame 3.

Figure 8:
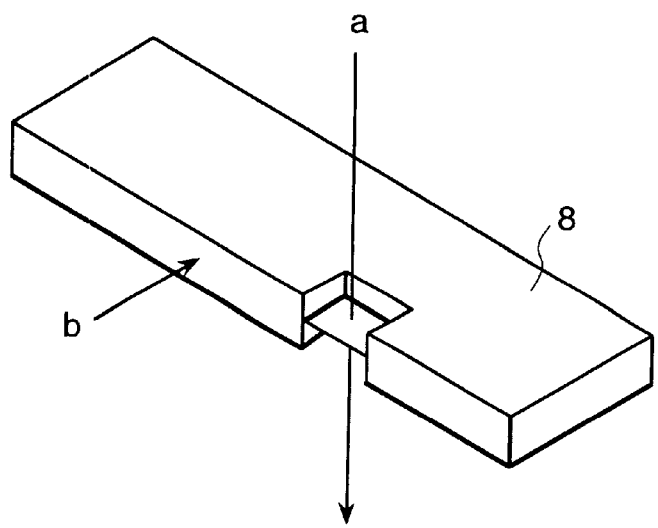
FIG. 8 is a schematic view showing an incident direction a of an electron beam to a sample at observation and an incident direction b of an FIB to a sample at milling.

Next, the holder is inserted into a TEM and connected to the heating power source 9 (S13). After that, transmission electron microscopic observation and EDX analysis are performed while the sample is being heated by conducting current to the heater 2 (S14). FIG. 8 is a schematic view showing an incident direction a of an electron beam to the sample 8 at observation and an incident direction b of an FIB to the sample 8 at milling in Step 18 to be described later. At TEM observation in Step 14, the electron beam is launched in the direction a in the TEM, and the transmitted electron beam is image formed, and the transmitted image is observed. Change of the sample 8 caused by heating can be observed by conducting current to the heater 2. Therein, the sample 8 is heated up to a high temperature in a short time since the sample 8 is heated from the both surface sides and heat dissipation is prevented by the heater envelope 1 made of a ceramic, and the heater 2 is fixed to the heater envelope 1 and the sample 8 is also fixed to the heater 2. Thus, thermal drift caused by temperature rise can be suppressed, and accordingly high temperature and atomic level observation can be performed. The sample 8 is tilted by rotating the holder shaft or by changing the position of the rod 7 to the heater envelope 1, if necessary.

After finishing observation of the sample under a heating condition, the heating is stopped (S15), and the sample 8 together with the holder is extracted from the TEM (S16) and inserted into the FIB apparatus (S17). In the FIB apparatus, the holder is set in such a direction that the focused ion beam is incident to the sample 8 from the direction of the arrow b shown in FIG. 8 to the sample 8 and through the slot 20 of the holder outer frame 3 and the opening 17 of the heater envelope 1. An un-milled bulk portion of the sample can be seen through the slot 20, and the position is sputtered with the FIB to obtain a new observation field (S18).

After finishing the FIB milling, the holder is extracted from the FIB milling apparatus (S19), and the sample 8 milled in the bulk portion is again inserted together with the holder (S20), and observation and analysis are performed (S21). By re-milling the un-milled portion of the sample 8 after heating according to the above-mentioned procedure, change in the bulk portion and change in the thin film portion caused by heating can be compared (S22).

Required time reaching a target temperature and change of sample drift over time were compared between the sample heating holder in accordance with the present invention and a conventional sample holder of heating furnace type. A sample to be used in the sample heating holder in accordance with the present invention was prepared by cutting an Si wafer of approximately 0.3 to 0.4 mm thickness to form an Si chip of 3 mm×2 mm×0.4 mm and thinning a part of the cut chip to approximately 0.1 µm thickness by FIB milling. The prepared sample was fixed to the heater in the manner as described above.

Figure 9:
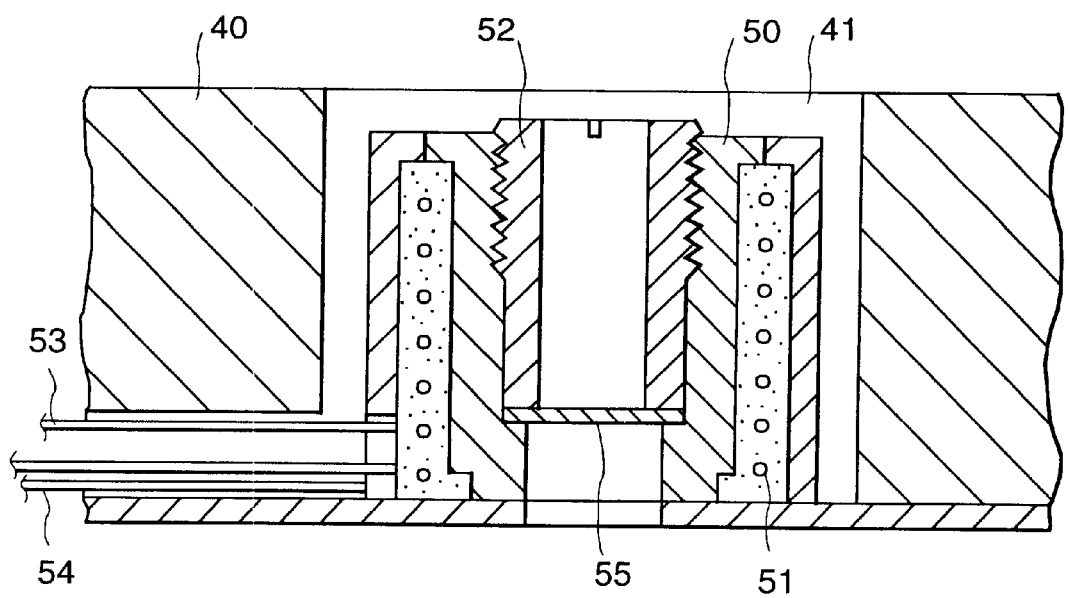
FIG. 9 is a schematic cross-sectional view showing a sample holder of a heating furnace type.

FIG. 9 is a schematic cross-sectional view showing the sample holder of heating furnace type. In the sample holder, a heating furnace 50 made of tantalum is arranged on a hole 41 provided in a holder main body 40, and a heater 51 is arranged around the heating furnace. A sample 55 is placed in a step portion of the heating furnace 50, and fixed by being pushed in the edge portion with a fixing screw 52. A lead wire 53 is connected to the heater 51. Further, a thermocouple 54 for monitoring temperature of the heating furnace is arranged. The sample 55 is prepared by milling an Si disk of 3 mm diameter and approximately 20 µm thickness to form a thin film by ion thinning. A portion of the thin film to be observed by a TEM is as extremely thin as several nm.

Figure 10:
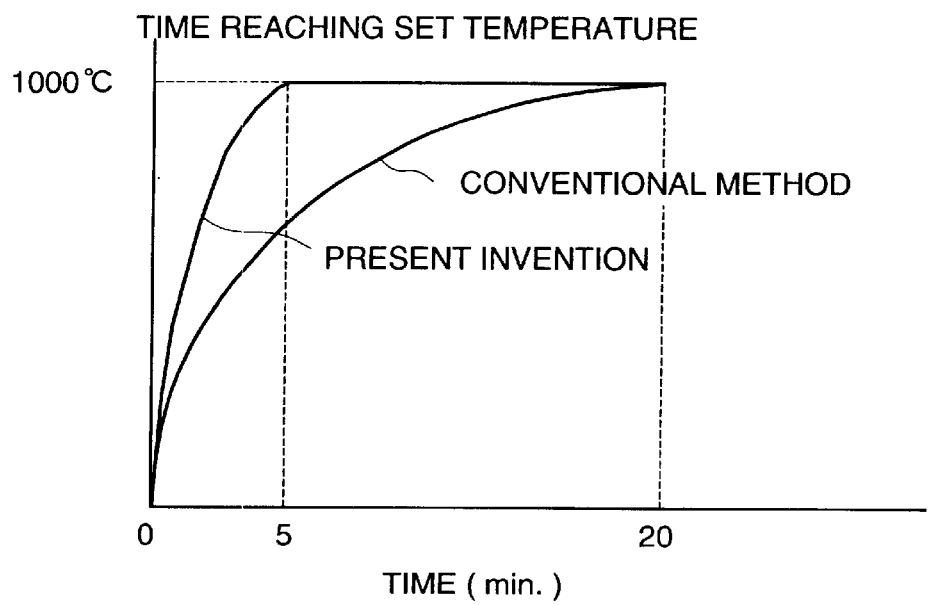
FIG. 10 is a graph showing comparison between the required time reaching a target temperature of the sample heating holder in accordance with the present invention and that of a conventional sample heating holder.

FIG. 10 shows comparison between the required time reaching a target temperature of the sample heating holder in accordance with the present invention and that of a conventional sample heating holder when the target temperature is set to 1000° C. The conventional sample holder required 20 minutes to reach the target temperature because of indirect heating which took a long time to transfer heat from the heater to the sample. On the other hand, the sample holder in accordance with the present invention could reach the target temperature in approximately 5 minutes.

Figure 11:
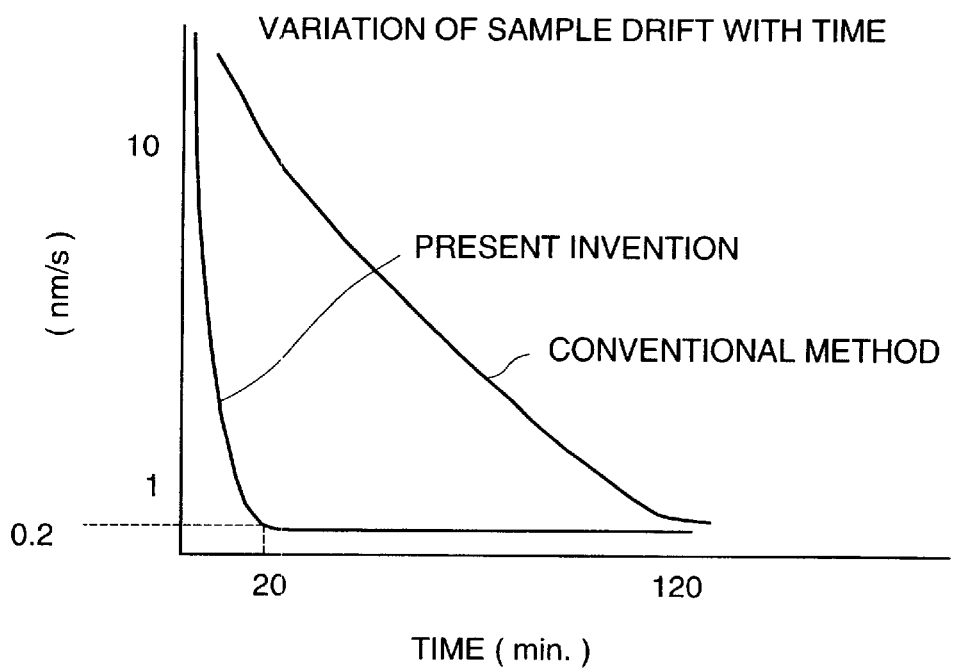
FIG. 11 is a graph showing comparison between the change of sample drift over time by the sample heating holder in accordance with the present invention and that by the conventional sample heating holder.

FIG. 11 shows comparison between the change of sample drift over time by the sample heating holder in accordance with the present invention and that by the conventional sample heating holder. The conventional sample holder required 120 minutes until the amount of drift per second was stabilized to 0.2 nm because of indirect heating which took a long time to stabilize the whole sample holder. On the other hand, in the sample holder in accordance with the present invention, the amount of drift was stabilized to the value 0.2 nm per second in approximately 20 minutes because the sample holder was of direct heating type by the heater, and the heater was fixed to the heater envelope, and the sample was also fixed to the heater.

Figure 12A:
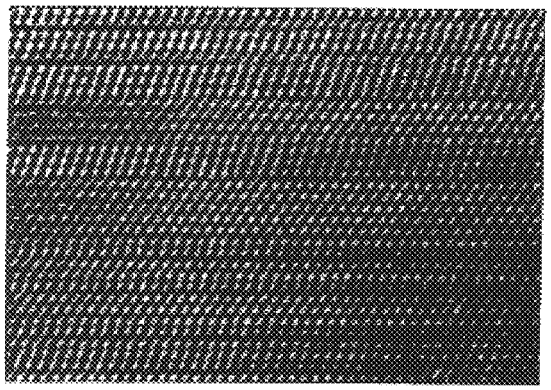
FIG. 12A and FIG. 12B are microscopic photographs showing examples of a TEM image of a thin film portion of a sample obtained using the sample heating holder and a TEM image obtained by milling a bulk portion of the sample after heating.
Figure 12B:
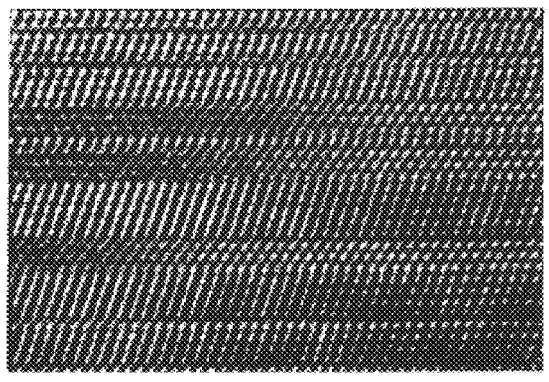

FIG. 12A and FIG. 12B are microscopic photographs showing examples of a TEM image of a thin film portion of a sample obtained using the sample heating holder and a TEM image obtained by milling a bulk portion of the sample after heating. FIG. 12A is a crystal lattice image of SiC heated up to approximately 1500° C. after being formed in a thin film by FIB milling. FIG. 12B is a crystal lattice image of SiC which was observed by again milling the bulk portion with FIB after observing the TEM image of FIG. 12A. In this example, both of the crystal lattice image of the bulk portion and the crystal lattice image of the thin film portion show a similar polymorphic structure. Therefore, in the comparison in Step 22 of FIG. 7, the change occurred in the thin film portion of the sample during the heating process, that is, the change observed by the TEM can be estimated to be the same as the change occurred in the bulk portion.

Figure 13:
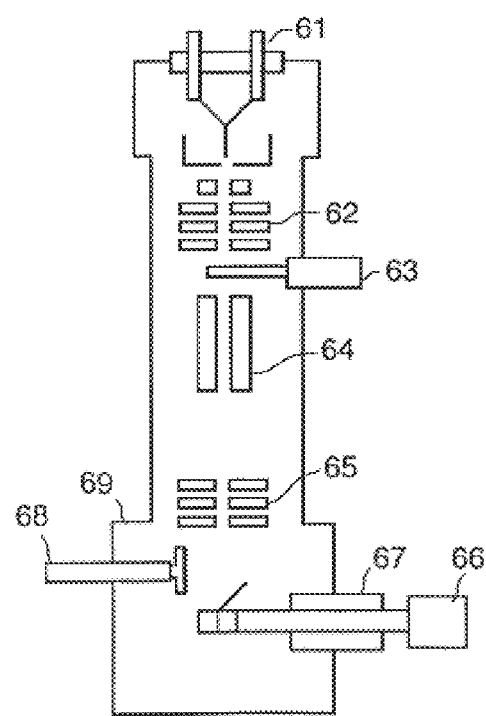
FIG. 13 is a view showing an example of an FIB milling apparatus to which the sample heating holder in accordance with the present invention is applied.

FIG. 13 is a view showing an example of an FIB milling apparatus to which the sample heating holder in accordance with the present invention is applied. The reference character 61 indicates an ion source, and an ion beam emitted from the ion source is irradiated onto a sample through a condenser lens 62, an aperture 63, a scanning deflector 64 and an objective lens 65. The sample is placed on a side-entry stage 66 including the sample heating holder in accordance with the present invention, and the side-entry stage 66 is inserted into a sample fine motion mechanism 67. Therefore, the sample can be freely moved to the irradiation position of the ion beam.

A secondary charged particle detector 68 is for detecting a secondary signal (secondary electrons, secondary ions or the like) produced from the sample by the ion beam, and the detected signal becomes a brightness signal of a CRT (not shown).

Further, a vacuum seal member is put between the side-entry stage 66 and the sample fine motion mechanism 67 so that a vacuum inside a sample chamber 69 can be maintained under a condition that the side-entry stage 66 is inserted into the sample fine motion mechanism 67.

Figure 14A:
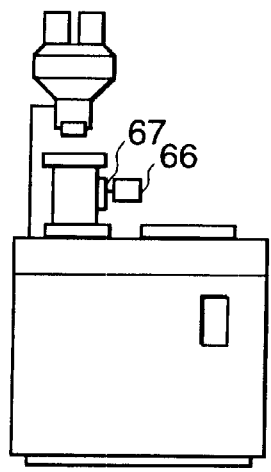
FIG. 14A to FIG. 14C are views showing other charged particle beam apparatuses to which the sample heating holder in accordance with the present invention is applied.
Figure 14B:
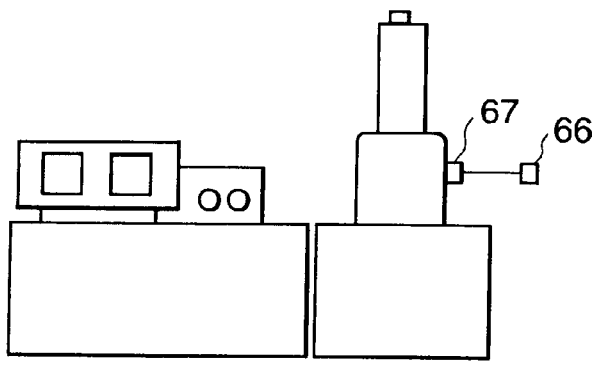
Figure 14C:
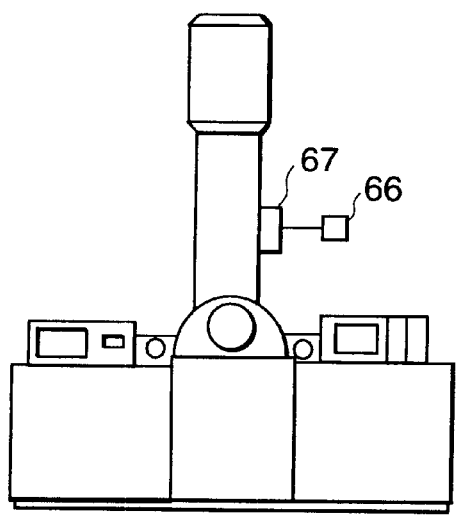

FIG. 14A to FIG. 14C are views showing apparatuses for further milling or observing an FIB milled sample. FIG. 14A is an argon milling apparatus, FIG. 14B is a scanning electron microscope (SEM) and FIG. 14C is a TEM described above. A point common to these apparatuses is that each of the apparatuses comprises a sample fine motion mechanism 67 having the same designed inserting port. Therefore, it is possible, for example, that a surface milled by FIB is etched to form an observation surface using the argon milling apparatus and observed with the SEM, and a result of the observation shows that a slightly deeper cross section of the observation portion should be observed, and the sample is again milled by FIB and finally observed using the TEM.

It is also possible that the portion of the sample heating holder in accordance with the present invention is designed so as to be detachable, and the holder portion is attached to the side-entry stage at TEM observation, and the portion is detached and attached to a stage provided in a sample chamber of the FIB milling apparatus at FIB milling.

As having been described above, according to the present invention, high resolution observation of a sample under high temperature using an electron microscope can be performed irrespective of shape of the sample and irrespective of direction of the sample to an electron beam, with suppressing drift caused by heat and with a high thermal efficiency. Further, re-milling of the sample using a focused ion beam milling apparatus and re-observation of the sample using electron microscope can be performed after observing the sample under a heating condition, and accordingly, observation of an inner bulk portion of the sample under a heating condition and verification by comparing it with a thin film portion can be performed.

What is claimed is:

1. A sample heating holder for an electron microscope comprising:
    a holder main body;
    a heater for heating a sample by directly contacting with the sample; and
    a thermally and electrically insulating heater envelope having a box-shape, for preventing dissipation of heat, covering said heater, said heater envelope having a carbon coating on its surface, said heater being fixed to said heater envelope.

2. A sample heating holder for electron microscope according to claim 1, wherein said heater envelope is made of a ceramic.

3. A sample heating holder for electron microscope according to claim 1, wherein said heater envelope is rotatably attached to said holder main body.

4. A sample heating holder for electron microscope according to claim 1, wherein said heater envelope is detachable to said holder main body.

5. A sample heating holder for electron microscope according to claim 1, wherein said heater envelope comprises an opening for letting an electron beam pass through; an opening for extracting an X-ray emitted from the sample by irradiation of the electron beam; and an opening for loading and unloading the sample.

6. A method of observing a sample using the sample heating holder for electron microscope according to claim 1, comprising fixing the sample to the heater using a high temperature thermosetting liquid inorganic heat resistant adhesive.

7. A sample heating holder for an electron microscope comprising:
    a holder main body;
    a heater for heating a sample by directly contacting with the sample; and
    a thermally and electrically insulating heater envelope having a box-shape, for preventing dissipation of heat, covering said heater, said heater envelope having a carbon coating on its surface, said heater being fixed to said heater envelope, wherein said heater envelope comprises an opening for letting a focused ion beam for milling the sample pass through in a side surface portion.

8. A sample heating holder for electron microscope according to claim 7, wherein said holder main body comprises an opening at a position overlapping with the opening formed on the side surface of said heater envelope.

9. A sample heating holder for an electron microscope according to claim 7, wherein said holder main body comprises an opening at a position overlapping with the opening formed on the side surface of said heater envelope.

10. A method of observing a sample using a sample heating holder for an electron microscope which includes a holder main body, a heater for heating a sample by directly contacting with the sample; and a thermally and electrically insulating heater envelope having a box-shape, for preventing dissipation of heat, covering said heater, said heater envelope having a carbon coating on its surface, said heater envelope comprises an opening for letting a focused ion beam for milling the sample pass through in a side surface portion, comprising the steps of:
    observing a sample fixed to and heated by the heater of the sample heating holder using an electron microscope;
    extracting the sample heating holder from the electron microscope and milling an unmilled bulk portion of the sample using a focused ion beam milling apparatus without detaching the sample from said heater; and
    loading the heater of the sample heating holder holding the milled sample to the electron microscope and observing the portion of the sample milled in the above step using the electron microscope.

11. A charged particle beam apparatus, which comprises:
    a charged particle source; and
    a sample heating holder having a holder main body, a heater for heating a sample by directly contacting with the sample and a thermally and electrically insulating heater envelope having a box-shape, shape for preventing dissipation of heat, covering said heater, disposed in the path of a charged particle beam emitted from said charged particle source, said heater envelope comprising a carbon coating on its surface, said heater comprising an opening for inserting a side-entry stage having a sample heater holder fixed to said heater envelope.

12. A charged particle beam apparatus, which comprises:
a charged particle source; and
a sample heating holder having a holder main body, a heater for heating a sample by directly contacting with the sample and a thermally and an electrically insulating heater envelope having a box-shape, for preventing dissipation of heat, covering said heater, disposed in the path of a charged particle beam emitted from said charged particle source, said heater envelope comprising a carbon coating on its surface, said heater comprising a sample stage for attaching a sample heating holder fixed to said heater envelope.

* * * * *